US009142491B2

(12) United States Patent
Warren et al.

(10) Patent No.: US 9,142,491 B2
(45) Date of Patent: Sep. 22, 2015

(54) SEMICONDUCTOR PACKAGE WITH CORNER PINS

(71) Applicant: Conexant Systems, Inc., Irvine, CA (US)

(72) Inventors: Robert W. Warren, Newport Beach, CA (US); Hyun Jane Lee, Aliso Viejo, CA (US); Nic Rossi, Causeway Bay (HK)

(73) Assignee: CONEXANT SYSTEMS, INC., Irvine, CA (US)

( * ) Notice: Subject to any disclaimer, the term of this patent is extended or adjusted under 35 U.S.C. 154(b) by 174 days.

(21) Appl. No.: 14/040,429

(22) Filed: Sep. 27, 2013

(65) Prior Publication Data

US 2014/0091448 A1    Apr. 3, 2014

Related U.S. Application Data

(60) Provisional application No. 61/707,638, filed on Sep. 28, 2012.

(51) Int. Cl.
*H01L 23/495* (2006.01)
*H01L 21/78* (2006.01)
*H01L 21/56* (2006.01)

(52) U.S. Cl.
CPC .............. *H01L 23/495* (2013.01); *H01L 21/78* (2013.01); *H01L 23/49541* (2013.01); *H01L 21/568* (2013.01); *H01L 23/49582* (2013.01); *H01L 2224/48247* (2013.01); *H01L 2224/49171* (2013.01); *H01L 2924/30107* (2013.01)

(58) Field of Classification Search
USPC .................. 257/666–677, E23.031–E23.059, 257/E23.004, E23.043–E23.05, E21.499, 257/737, E23.141, 99, E23.011, E23.069, 257/E23.07; 438/111, 112, 123, 127, 119, 438/124, 27, 26
See application file for complete search history.

(56) References Cited

U.S. PATENT DOCUMENTS

| 5,235,207 | A | * | 8/1993 | Ohi et al. ........................ 257/670 |
| 5,895,967 | A | * | 4/1999 | Stearns et al. ................. 257/691 |
| 7,851,897 | B1 | * | 12/2010 | Cate et al. ....................... 257/678 |
| 2002/0024127 | A1 | * | 2/2002 | Sakuraba et al. .............. 257/686 |
| 2003/0168719 | A1 | * | 9/2003 | Cheng et al. ................... 257/666 |
| 2006/0049492 | A1 | * | 3/2006 | Holloway et al. .............. 257/666 |
| 2007/0161157 | A1 | * | 7/2007 | Islam et al. .................... 438/120 |
| 2008/0158839 | A1 | * | 7/2008 | Nishida ......................... 361/767 |
| 2009/0166828 | A1 | * | 7/2009 | Upadhyayula et al. ........ 257/676 |
| 2009/0243054 | A1 | * | 10/2009 | Yeung et al. ................... 257/666 |
| 2011/0115063 | A1 | * | 5/2011 | Sharma et al. ................. 257/676 |
| 2012/0108013 | A1 | * | 5/2012 | Fujisawa et al. .............. 438/123 |

* cited by examiner

*Primary Examiner* — Dao H Nguyen
*Assistant Examiner* — Tram H Nguyen
(74) *Attorney, Agent, or Firm* — Haynes and Boone, LLP

(57) ABSTRACT

There are provided semiconductor packages having corner pins and methods for their fabrication. Such a semiconductor package includes a leadframe and a die paddle, the leadframe having first and second edge sides meeting to form a first corner. The semiconductor package also includes edge pins arrayed substantially parallel to the first edge side and edge pins arrayed substantially parallel to the second edge side. In addition, the semiconductor package includes a first corner pin situated at the first corner, the first corner pin being electrically isolated from the die paddle.

20 Claims, 5 Drawing Sheets

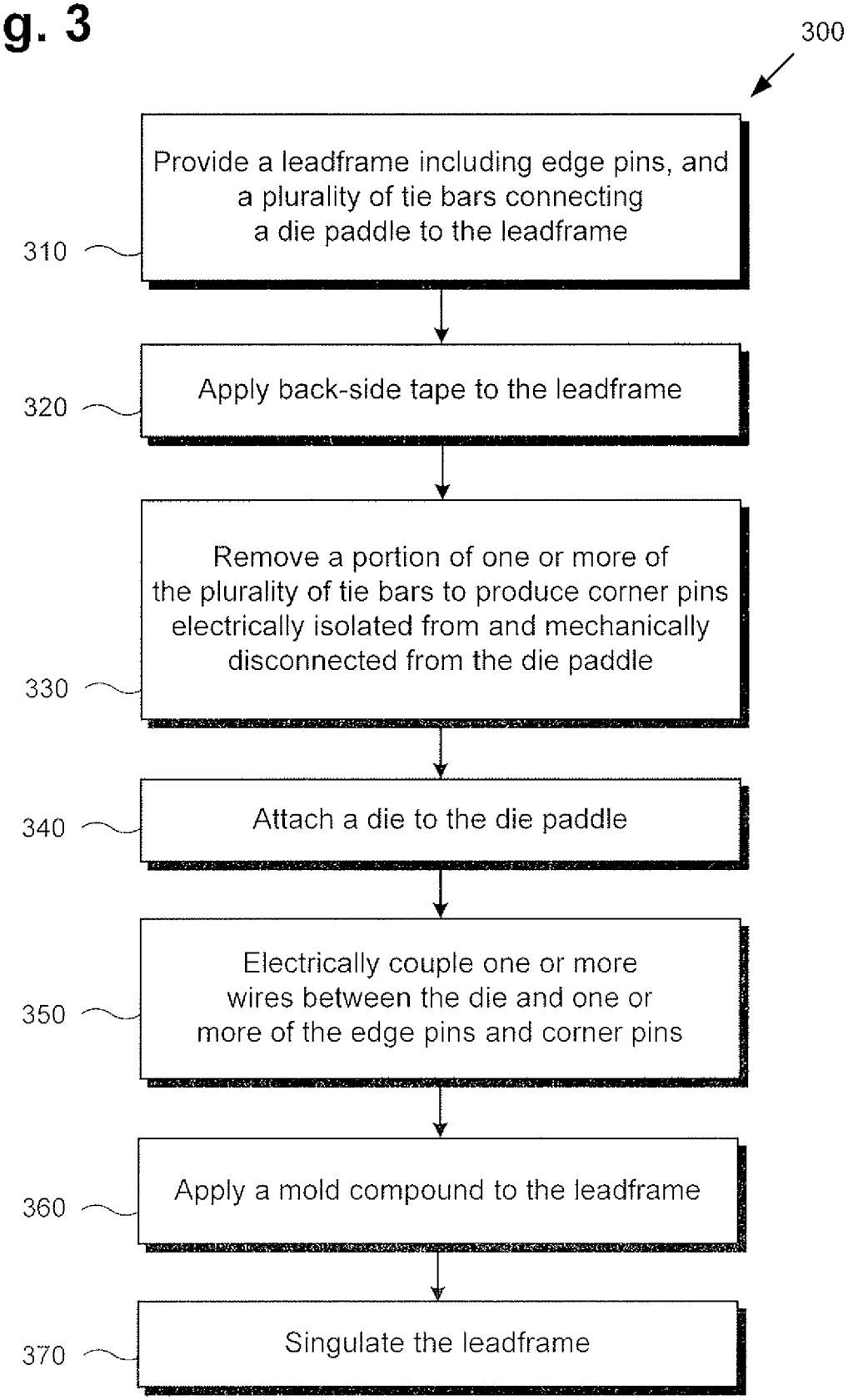

SEMICONDUCTOR PACKAGE WITH CORNER PINS

BACKGROUND

The present application claims the benefit of and priority to U.S. Provisional Patent Application Ser. No. 61/707,638, filed Sep. 28, 2012, entitled "Quad Flat No Lead Package With Corner Pins," which is hereby incorporated fully by reference into the present application.

BACKGROUND

Flat no-leads packaging solutions, such as Quad-Flat No-Leads (QFN) packages offer several benefits. For example, QFN packages can provide reduced lead inductances, a small, nearly chip scale footprint, a thin profile, and low weight. QFN packages also offer perimeter or edge input/output (I/O) pads, thereby facilitating printed circuit board (PCB) trace routing. Moreover, QFN packages may include an exposed conductive die paddle enabling good thermal and electrical performance.

As semiconductor technologies become more complex, the number of required I/O terminals on semiconductor packages continues to increase. Conventional QFN packaging solutions have included single-row or multi-row QFN packages. Such conventional QFN packages are typically limited to less than 100 leads in single row perimeter designs, and less than 165 leads for dual row designs. As designs move to the current minimum terminal pitch of approximately 0.4 mm, a conventional approach to accommodating the increased number of I/O terminals is to move to a QFN package having a larger body size. However, moving to a larger QFN body size undesirably results in a costlier, thicker, and heavier semiconductor package.

SUMMARY

There are provided semiconductor packages with corner pins and methods for their fabrication, substantially as shown in and/or described in connection with at least one of the figures, and as set forth more completely in the claims.

BRIEF DESCRIPTION OF THE DRAWINGS

The features and advantages of the present application will become more readily apparent to those ordinarily skilled in the art after reviewing the following detailed description and accompanying drawings, wherein:

FIG. 3 shows a flowchart describing an exemplary method for fabricating a semiconductor package having corner pins.

DETAILED DESCRIPTION

Figure 1A:
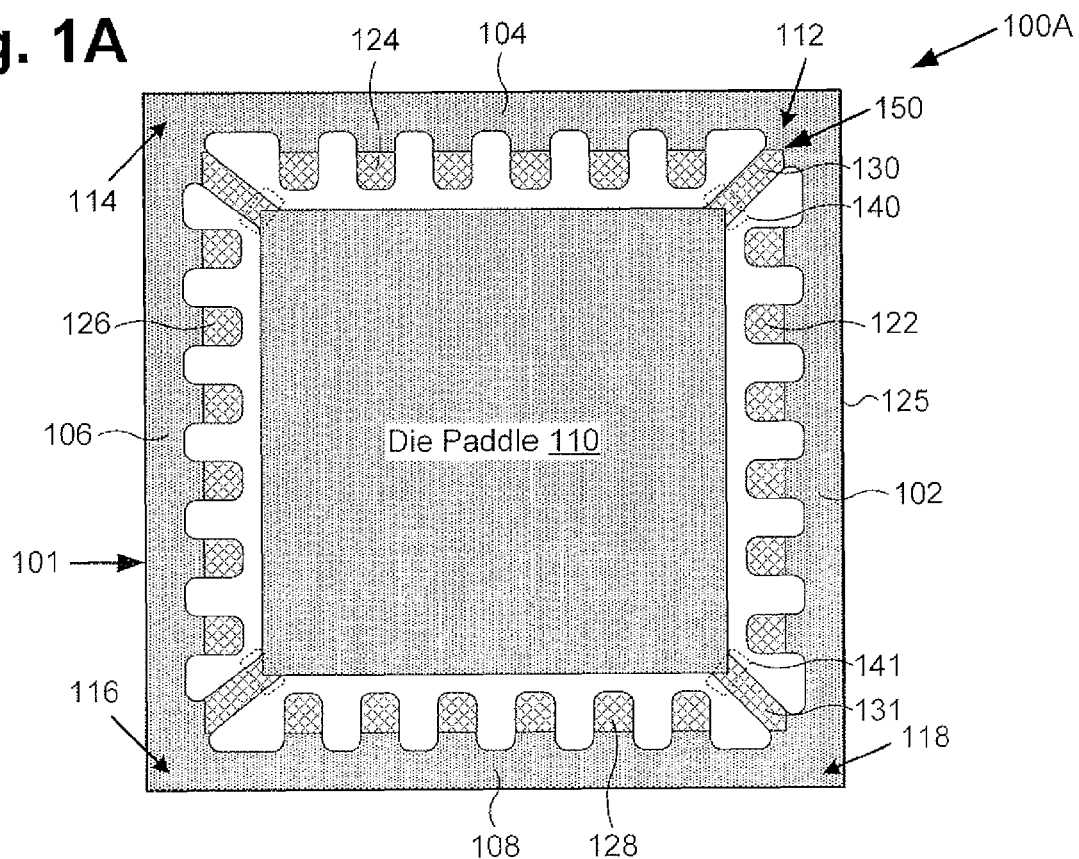
FIG. 1A shows a top view of a package at an initial stage of a method for fabricating a semiconductor package having corner pins, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, semiconductor technologies continue to become more complex. As a result, the number of required input/output (I/O) terminals on semiconductor packages continues to increase. Conventional solutions have included single-row or multi-row Quad-Flat No-Leads (QFN) packages, which may accommodate an increased number of I/O terminals on the perimeter of a semiconductor package. QFN packages offer a variety of benefits including reduced lead inductance, near chip-scale footprints, a thin profile, low weight, and good thermal and electrical performance due to exposed copper die paddles. However, QFN packages are typically limited to less than 100 leads in single row perimeter designs, and less than 165 leads for dual row designs. As designs move to the current minimum terminal pitch of 0.4 mm, the most common solution for providing more terminals is to move to a larger body size QFN package, which can have undesirable consequences in terms of the cost, thickness, and weight of the semiconductor package.

Various implementations disclosed by the present application provide for adding pins at one or more corners of a QFN package, where conventional QFN designs provide electrically non-functional tie bars. This concept may be enabled by adding lead fingers, or corner pins, at the corners of the leadframe. Accordingly, additional pins, such as 4 additional corner pins, may be added per package body size. For example, a conventional 3×3 mm QFN with 12 pins at a 0.5 mm pitch spacing may now provide 16 pins (a 33% increase), while a conventional 6×6 mm QFN with 40 pins at a 0.5 mm pitch spacing may now provide 44 pins (a 10% increase) for substantially the same cost and without increasing package size, thickness, or weight.

The present application contemplates at least two orientations for the tie bars, some or all of which may subsequently be fabricated into corner pins. A first orientation may result in corner pins formed from the tie bars in a diagonal orientation with respect to the conventional edge pins and a semiconductor package leadframe. A second orientation may result in the additional pins formed from the tie bars having substantially the same orientation as the conventional edge pins, i.e., being substantially parallel to an edge side of the package leadframe. The first orientation may relate to FIGS. 1A through 1D, while the second orientation may relate to FIGS. 2A through 2D.

An implementation of the present application will now be discussed with respect to FIGS. 1A through 1D and FIG. 3. FIGS. 1A through 1D present exemplary progressive top views of packages 100A through 100D, such as QFN packages, fabricated so as to have corner pins in accordance with one or more implementations of the present application. FIG. 3 presents an exemplary flowchart of a method for fabricating a semiconductor package, such as a QFN package, having corner pins in accordance with one or more implementations of the present application.

Flowchart 300 of FIG. 3 may begin with providing leadframe 101 including one or more pluralities of edge pins and a plurality of tie bars connecting die paddle 110 to leadframe 101 (310). In some implementations, providing leadframe 101 may include fabricating the leadframe. A non-limiting example of a material for fabricating the leadframe may be copper. The leadframe may be fabricated by any etch process known to those of ordinary skill in the art. Such an etch may be a two-step process. For example, a full etch may be utilized to define edge pins, tie bars, and a die paddle of the leadframe. In addition, a half etch may be performed to delineate areas of the leadframe that will subsequently be covered by a molding compound. For example, if desired, fabricated edge pins and tie bars may also be half etched so they may be sealed by a molding compound.

FIG. 1A shows package 100A including lead frame 101 and die paddle 110. As shown in FIG. 1A, leadframe 101 has first edge side 102, second edge side 104, third edge side 106, and fourth edge side 108. As further shown in FIG. 1A, first edge side 102 meets second edge side 104 to form first corner 112, and second edge side 104 meets third edge side 106 to form second corner 114, while fourth edge side 108 meets third edge side 106 to form third corner 116 and meets first edge side 102 to form fourth corner 118.

According to the implementation shown in FIG. 1A, first, second, third, and fourth pluralities of edge pins (such as I/O pins) are arrayed substantially parallel to respective first, second, third, and fourth edge sides 102, 104, 106, and 108. That is to say, a first plurality of edge pins represented by edge pin 122 is arrayed substantially parallel to first edge side 102, a second plurality of edge pins represented by edge pin 124 is arrayed substantially parallel to second edge side 104, a third plurality of edge pins represented by edge pin 126 is arrayed substantially parallel to third edge side 106, and a fourth plurality of edge pins represented by edge pin 128 is arrayed substantially parallel to fourth edge side 108. Each of the edge pins may initially be connected to a bus bar, such as representative bus bar 125.

Leadframe 101 may additionally include tie bars at each corner, for example, tie bars 130 and 131 at respective first corner 112 and fourth corner 118. The tie bars initially provide mechanical support for die paddle 110, which is connected to leadframe 101 by the tie bars. During leadframe fabrication, the tie bars may be specifically designed such that corner pins matching the design rules for the edge pins result after a punch process removes a portion of the tie bars.

A highly conductive metallic plating 150 may also be applied to the edge pins and tie bars. Metallic plating 150 may comprise silver, gold, or any other metal having a comparatively low electrical resistance. Metallic plating 150 may be applied using ring plating, spot plating or uniform plating across the entire leadframe, depending on the particular application. Excise points 140 and 141 may represent portions of tie bars 130 and 131, respectively, which will be punched out or otherwise removed to produce corner pins.

Flowchart 300 may continue with applying back-side tape to leadframe 101 (320). For example, the back-side tape may be applied prior to a die-attach process. Conventional fabrication of punch-type QFN packages does not typically include application of back-side tape to the leadframe. However, application of back-side tape prior to the die-attach process may prevent mold flashing from accidentally covering portions of an exposed die paddle or the backside of the leadframe during a subsequent molding compound deposition process. In addition, the use of back-side tape is less expensive than performing a mild etch to remove mold flashing formed if the back-side tape was not used. The back-side tape may additionally provide mechanical stability to the leadframe when the tie bars are punched or otherwise partially removed. In some large QFN applications, the back-side tape may optionally be applied only under the edge pins and tie bars in order to hold the edge pins and tie bars in place.

Figure 1B:
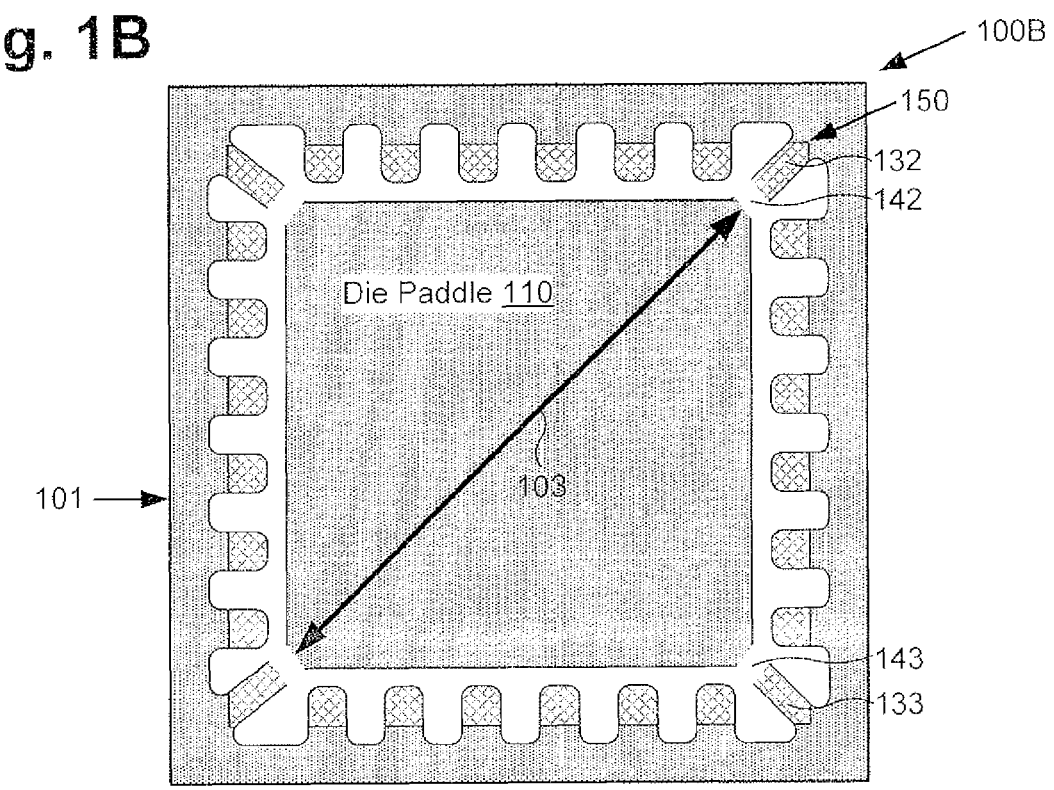
FIG. 1B shows a top view of the package of FIG. 1A at an intermediate stage of an exemplary method for fabricating a semiconductor package having corner pins.

Flowchart 300 of FIG. 3 may continue with removing a portion of one or more of the plurality of tie bars including tie bars 130 and 131 to produce corner pins electrically isolated from and mechanically disconnected from die paddle 110 (330). FIG. 1B shows package 100B, which may represent package 100A of FIG. 1A after removal of a portion of tie bars 130 and 131 to produce respective corner pins 132 and 133. Gaps 142 and 143 may represent the portions of tie bars 130 and 131, respectively, which are removed. Also shown in FIG. 1B is exemplary diagonal 103 of leadframe 101. It is noted that in the implementation shown in FIG. 1B, corner pin 132 is oriented substantially parallel to diagonal 103 of leadframe 101. That is to say, corner pin 132 has a major axis substantially parallel to diagonal 103.

Because leadframes may be fabricated in strips of an array of between 100 and 1000 devices units, gang punching of all tie bars within a strip may be accomplished in a single-step. Although maximum benefit in terms of total number of pins (i.e., edge pins plus corner pins) is realized by punching out all four tie bars, the punch steps may be reduced by punching only one or two of the tie bars. This may be desirable for small leadframes having few pins. For example, 3×3 mm leadframes conventionally having 12 pins may be fabricated to have 14 pins rather than the full complement of 16 pins achievable according to another implementation of the present application.

At this point in fabrication, the edge pins, originally attached to bus bar 125, may be singulated, allowing for strip-level testing of each of the edge pins and corner pins before singulation of each leadframe. This may allow faster, more efficient and lower cost quality control testing of devices on the leadframe.

Flowchart 300 of FIG. 3 may continue with attaching die 180, such as an active die, to die paddle 110 (340). Die 180 may be attached to die paddle 110 in any manner known to those of skill in the art, depending on the particular application.

Figure 1C:
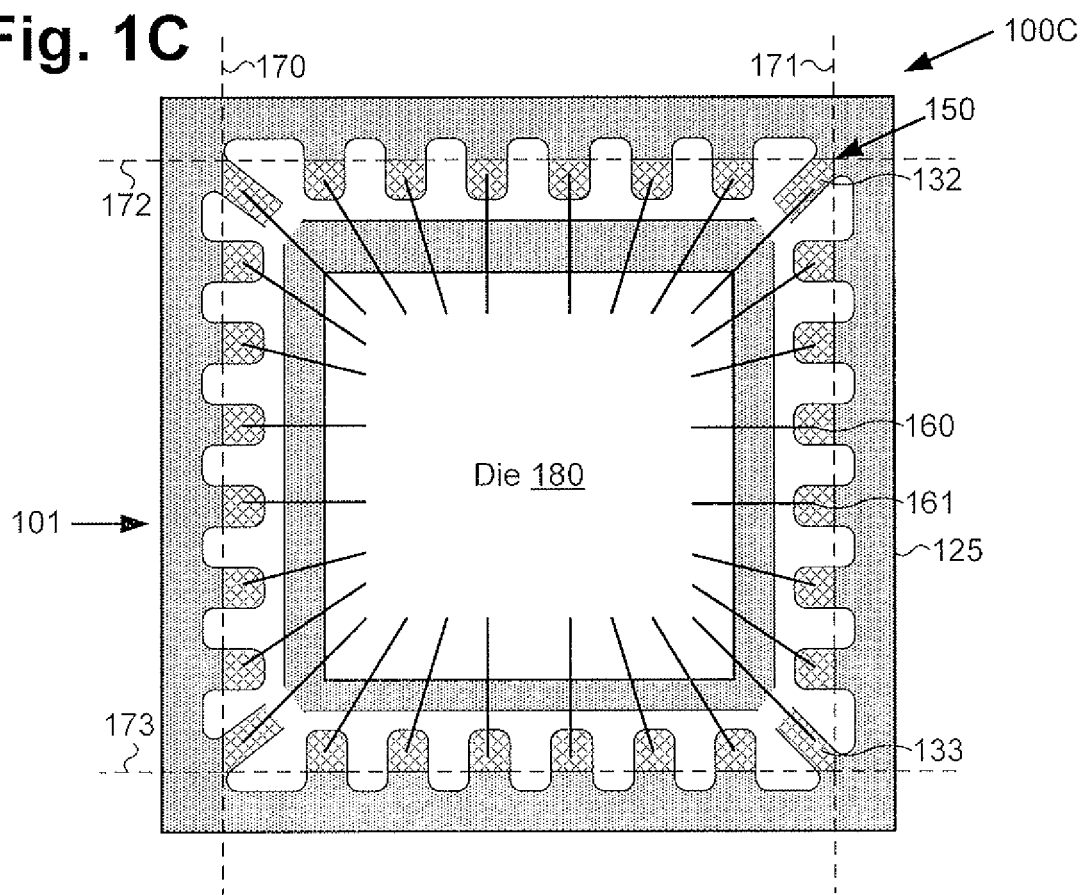
FIG. 1C shows a top view of the package of FIG. 1B at another intermediate stage of an exemplary method for fabricating a semiconductor package having corner pins.

Flowchart 300 continues with electrically coupling one or more wires, represented by wires 160 and 161, between die 180 and one or more of the edge pins and corner pins (350). FIG. 1C shows package 100C, which may represent package 100B of FIG. 1B after the electrical coupling of die 180 to the edge pins and corner pins. FIG. 1C shows die 180 attached to die paddle 110 and several wires wire bonded between die 180 and the edge pins and corner pins. Thus, each of tie bat's 130 and 131 in FIG. 1A, which were conventionally electrically useless, are now usable as respective corner pins 132 and 133 for electrical connection. Excise lines 170, 171, 172 and 173 may indicate positions where leadframe 101 may be singulated from the leadframe array or strip during a subsequent fabrication stage.

Flowchart 300 may continue with applying a mold compound to the leadframe (360). The mold compound can provide added strength to the leadframe package as well as prevent unintended electrical shorting of portions of the leadframe. Thus, due to the application of the back-side tape (320), and the mold compound (360), the tie bars are no longer needed for their conventional purpose of structural support. Once the mold compound has been applied to the leadframe, the back-side tape may be removed and a post-mold cure may be performed.

Figure 1D:
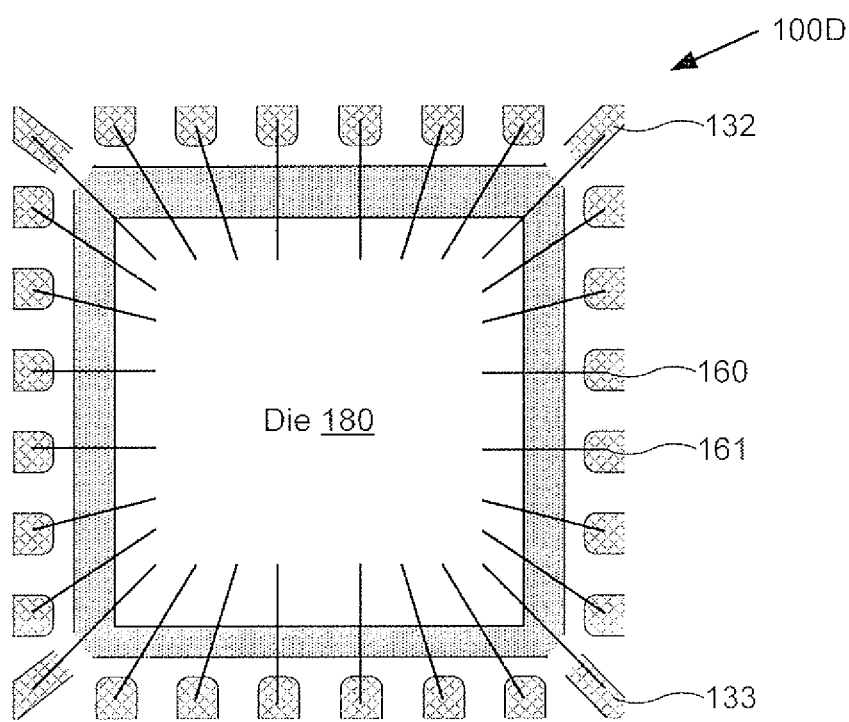
FIG. 1D shows a top view of the package of FIG. 1C at a later stage of an exemplary method for fabricating a semiconductor package having corner pins.

Flowchart 300 may conclude with singulating the leadframe (370). The singulation may be carried out by any method known to those of ordinary skill in the art and may include laser marking the leadframes before singulation. FIG. 1D shows package 100D, which may represent package 100C of FIG. 1C after singulation. For example, leadframe 101 may be singulated after laser marking along excise lines 170-173 to provide a leadframe having an increased number of pins for electrical connection with die 180 on die paddle 110 without requiring a larger sized leadframe. The leadframe may then be attached to a larger semiconductor package for final assembly.

Another implementation of the present inventive concepts will now be discussed with respect to FIGS. 2A through 2D and FIG. 3. FIGS. 2A through 2D present exemplary progressive top views of packages 200A through 200D, such as QFN packages, fabricated so as to have corner pins in accordance with one or more implementations of the present application. In addition, FIGS. 2A through 2D are substantially identical to FIGS. 1A through 1D, respectively, with the exception that the portions of the tie bars remaining after punch-out (i.e., the corner pins) may have substantially the same orientation as the edge pins, rather than the diagonal orientation shown in FIGS. 1A through 1D. Elements having similar numerals between FIGS. 1A-1D and FIGS. 2A-2D may correspond to similar elements.

Figure 2A:
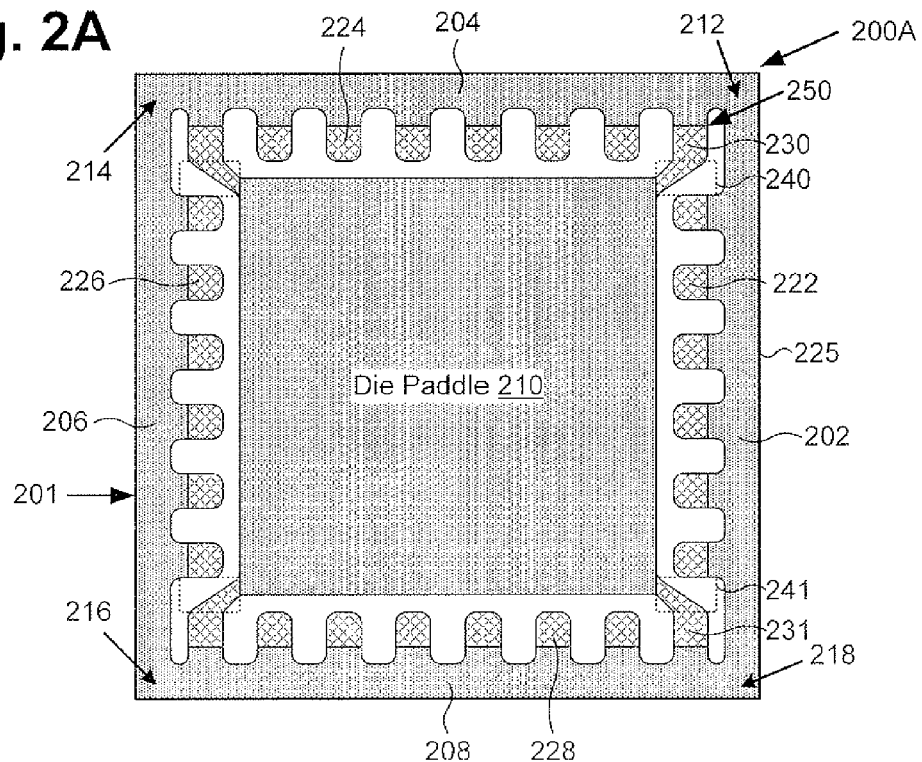
FIG. 2A shows a top view of a package at an initial stage of a method for fabricating a semiconductor package having corner pins, according to another implementation.

FIG. 2A shows package 200A including lead frame 201 and die paddle 210. As shown in FIG. 2A, leadframe 201 has first edge side 202, second edge side 204, third edge side 206, and fourth edge side 208. As further shown in FIG. 2A, first edge side 202 meets second edge side 204 to form first corner 212, and second edge side 204 meets third edge side 206 to form second corner 214, while fourth edge side 208 meets third edge side 206 to form third corner 216 and meets first edge side 202 to form fourth corner 218.

According to the implementation shown in FIG. 2A, first, second, third, and fourth pluralities of edge pins (such as I/O pins) are arrayed substantially parallel to respective first, second, third, and fourth edge sides 202, 204, 206, and 208. That is to say, a first plurality of edge pins represented by edge pin 222 is arrayed substantially parallel to first edge side 202, a second plurality of edge pins represented by edge pin 224 is arrayed substantially parallel to second edge side 204, a third plurality of edge pins represented by edge pin 226 is arrayed substantially parallel to third edge side 206, and a fourth plurality of edge pins represented by edge pin 228 is arrayed substantially parallel to fourth edge side 208. Each of the edge pins may initially be connected to a bus bar, such as representative bus bar 225.

Leadframe 201 may additionally include tie bars in each corner, for example, tie bars 230 and 231. The tie bars initially provide mechanical support for die paddle 210, which is connected to leadframe 201 by the tie bars. During leadframe fabrication, the tie bars may be specifically designed such that corner pins matching the design rules for the edge pins result after a subsequent punch action.

A highly conductive metallic plating 250 may also be applied to the edge pins and tie bars. Metallic plating 250 may comprise silver, gold, or any metal having a comparatively low electrical resistance and may be applied by ring plating, spot plating or uniform plating across the entire leadframe, depending on the particular application. Excise points 240 and 241 may show portions of tie bars 230 and 231, respectively, which will be punched out or otherwise removed to produce corner pins.

Figure 2B:
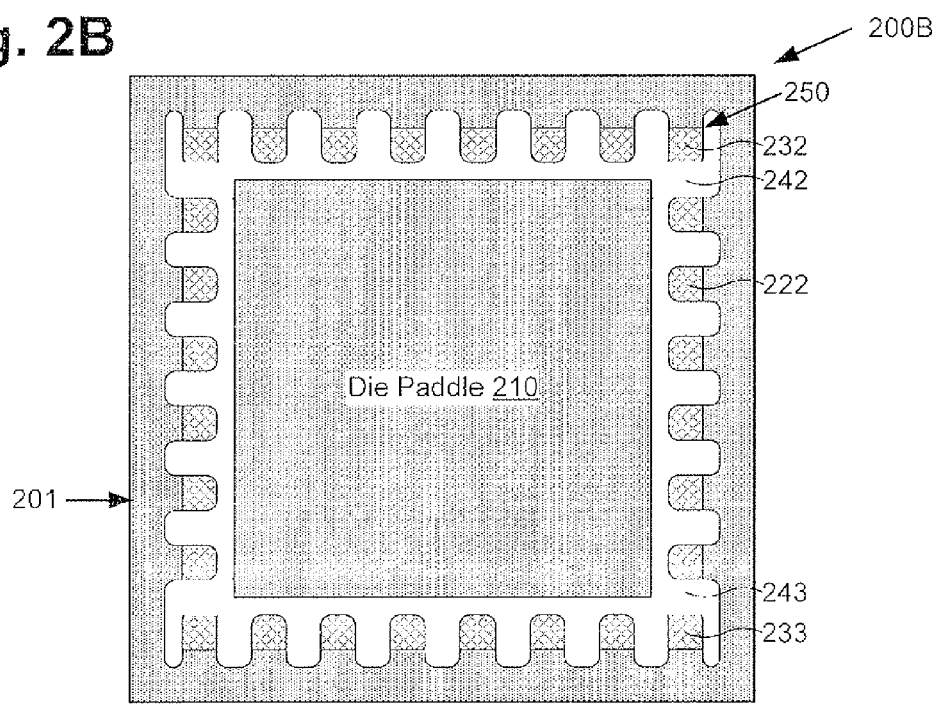
FIG. 2B shows a top view of the package of FIG. 2A at an intermediate stage of an exemplary method for fabricating a semiconductor package having corner pins.

FIG. 2B shows package 200B, which may represent package 200A of FIG. 2A after removing a portion of tie bars 230 and 231 to produce respective corner pins 232 and 233 (330). Gaps 242 and 243 may represent the portions of tie bars 230 and 231, respectively, which are removed. It is noted that according to the implementation shown in FIG. 2B, corner pin 232 is oriented substantially parallel to first edge side 202 of leadframe 201. That is to say, corner pin 232 has a major axis substantially parallel to first edge side 202. In other implementations, however, corner pin 232 may be oriented substantially parallel to second edge side 204.

Because leadframes may be fabricated in arrays and sawed into strips of between 100 and 1000 leadframes, gang punching of entire rows or columns of tie bars may be accomplished in a stepwise manner. Although maximum benefit in terms of number of pins is realized by punching out all four tie bars, one or more added punch steps may be avoided by punching only two of the tie bars. At this point in fabrication, the edge pins, originally attached to bus bar 225, may be singulated, allowing for strip-level testing of each of the edge pins and corner pins before singulation of each leadframe. This may allow faster, more efficient and lower cost quality control testing of each leadframe.

Figure 2C:
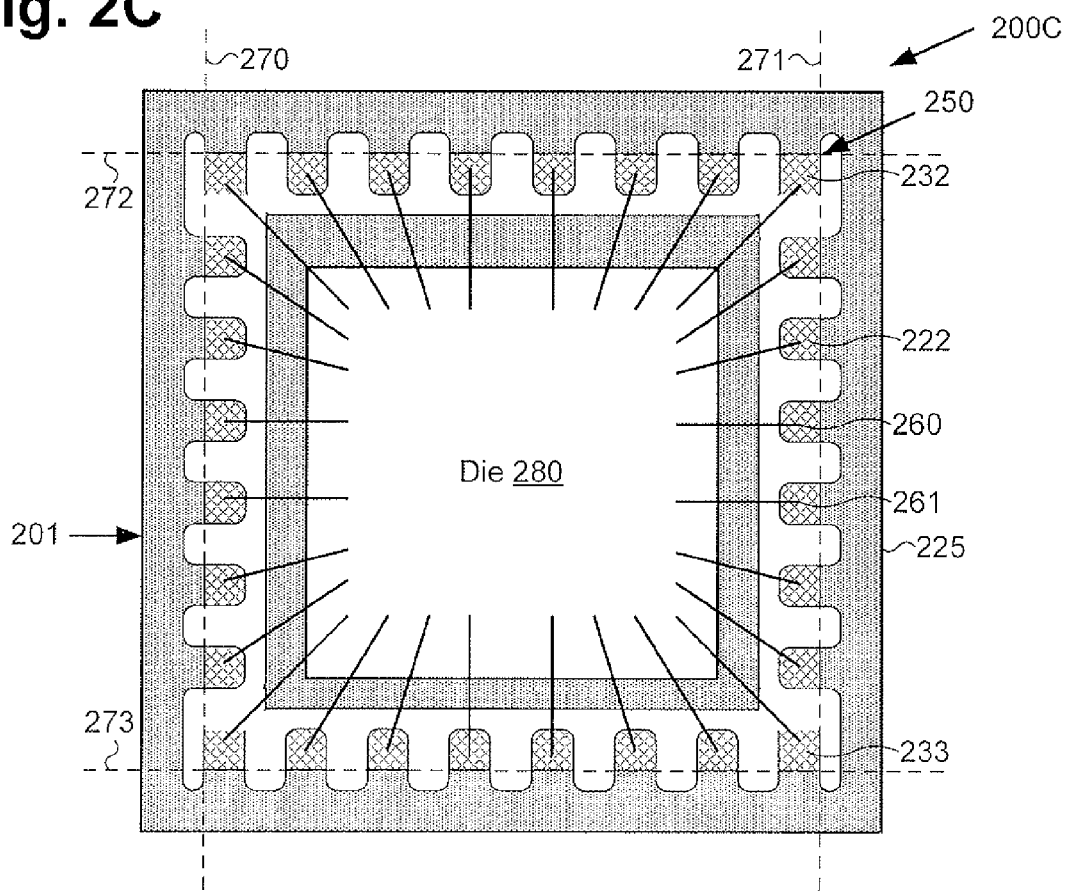
FIG. 2C shows a top view of the package of FIG. 2B at another intermediate stage of an exemplary method for fabricating a semiconductor package having corner pins.

FIG. 2C shows package 200C, which may represent leadframe 200B of FIG. 2B after wire bonding (350). Die 280 may be attached to die paddle 210 and several wires, represented by wires 260 and 261, may be wire bonded between die 280 and the edge pins and corner pins. Thus, each of the tie bars shown in FIG. 2A, which are conventionally electrically useless, are now usable as corner pins for electrical connection. Excise lines 270, 271, 272 and 273 may indicate positions where leadframe 201 may be singulated from the leadframe array or strip during a subsequent fabrication stage.

Figure 2D:
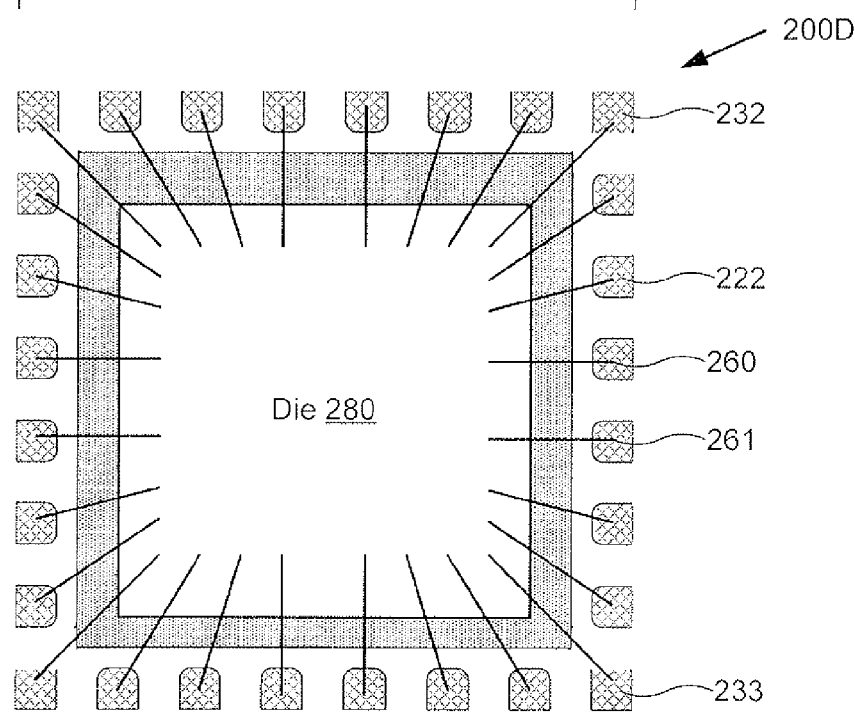
FIG. 2D shows a top view of the package of FIG. 2C at a later stage of an exemplary method for fabricating a semiconductor package having corner pins.

FIG. 2D shows package 200D, which may represent package 200C of FIG. 2C after singulation of leadframe 201 (370). For example, leadframe 201 may be singulated after laser marking along excise lines 270-273 to provide package 200D having an increased number of pins for electrical connection without requiring a larger sized leadframe. The leadframe may then be attached to a larger package for final assembly, for example as a QFN package.

Although the above examples have been shown with respect to QFN packages, the inventive concepts of the present application may be applied equally well to any packages where conventional tie bars are used. Examples may include, but are not limited to, small outline packages (SOP), quad flat packages (QFP) and plastic dual inline packages (PDIPs). Accordingly, the present inventive concepts provide for the fabrication of leadframe packages having corner pins at the corners of the leadframe, thus allowing additional pins to be added without increasing fabrication cost, package size, thickness or weight.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A semiconductor package comprising:
   a leadframe and a die paddle, the leadframe having first and second edge sides meeting to form a first corner;
   a first plurality of edge pins arrayed substantially parallel to the first edge side and a second plurality of edge pins arrayed substantially parallel to the second edge side; and
   a first corner pin situated at the first corner, the first corner pin being electrically isolated from the die paddle.

2. The semiconductor package of claim 1, further comprising a die attached to the die paddle, the first and second pluralities of edge pins configured to be electrically coupled to the die.

3. The semiconductor package of claim 1, wherein the first corner pin is configured to be electrically coupled to a die attached to the die paddle.

4. The semiconductor package of claim 1, wherein the semiconductor package comprises a Quad-Flat No-Leads (QFN) package.

5. The semiconductor package of claim 1, wherein the first corner pin is oriented substantially parallel to one of the first and second edge sides of the leadframe.

6. The semiconductor package of claim 1, wherein the first corner pin is oriented substantially parallel to a diagonal of the leadframe.

7. The semiconductor package of claim 1, wherein the leadframe has a third edge side meeting the second edge side to form a second corner, the semiconductor package further comprising:
   a third plurality of edge pins arrayed substantially parallel to the third edge side; and
   a second corner pin situated at the second corner, the second corner pin being electrically isolated from the die paddle.

8. The semiconductor package of claim 7, wherein the first corner pin and the second corner pin are configured to be electrically coupled to a die attached to the die paddle.

9. The semiconductor package of claim 7, wherein the leadframe has a fourth edge side meeting the third and first edge sides to form respective third and fourth corners, the semiconductor package further comprising:
   a fourth plurality of edge pins arrayed substantially parallel to the fourth edge side; and
   a third corner pin situated at the third corner, the third corner pin being electrically isolated from the die paddle.

10. The semiconductor package of claim 9, further comprising a fourth corner pin situated at the fourth corner, the fourth corner pin being electrically isolated from the die paddle.

11. A method for fabricating a semiconductor package, the method comprising:
    providing a leadframe having a plurality of corners and a corresponding plurality of edge sides meeting to form the plurality of corners, a die paddle being connected to the plurality of corners by respective tie bars;
    applying a back-side tape to the leadframe;
    removing a portion of a first tie bar of the respective tie bars to produce a first corner pin at a first corner of the leadframe, the first corner pin being electrically isolated from the die paddle.

12. The method of claim 11, wherein the first corner pin is oriented substantially parallel to at least one of the plurality of edge sides of the leadframe.

13. The method of claim 11, wherein the first corner pin is oriented substantially parallel to a diagonal of the leadframe.

14. The method of claim 11, further comprising removing a portion of a second tie bar of the respective tie bars to produce a second corner pin at a second corner of the leadframe, the second corner pin being electrically isolated from the die paddle.

15. The method of claim 11, further comprising removing a portion of a second, a third, and a fourth tie bar of the respective tie bars to produce respective second, third, and fourth corner pins at respective second, third, and fourth corners of the leadframe, the second, third, and fourth corner pins being electrically isolated from the die paddle.

16. The method of claim 11, wherein the semiconductor package comprises a Quad-Flat No-Leads (QFN) package.

17. The method of claim 11, further comprising attaching a die to the die paddle.

18. The method of claim 17, further comprising electrically coupling the die to the first corner pin and to edge pins of the semiconductor package arrayed, respectively, substantially parallel each of the plurality of leadframe edge sides.

19. The method of claim 18, further comprising applying a mold compound to the leadframe.

20. The method of claim 19, further comprising singulating the leadframe.

* * * * *